(12) United States Patent
Carmichael

(10) Patent No.: US 11,901,918 B2
(45) Date of Patent: Feb. 13, 2024

(54) METHOD OF MODIFYING AN ANALOG WAVE OR DIGITAL PULSE TO CONVEY ADDITIONAL DATA WITH EACH WAVE OR PULSE

(71) Applicant: James Howard Carmichael, Costa Mesa, CA (US)

(72) Inventor: James Howard Carmichael, Costa Mesa, CA (US)

(73) Assignee: James H. Carmichael, Costa Mesa, CA (US)

( * ) Notice: Subject to any disclaimer, the term of this patent is extended or adjusted under 35 U.S.C. 154(b) by 0 days.

(21) Appl. No.: 17/455,782

(22) Filed: Nov. 19, 2021

(65) Prior Publication Data

US 2023/0163780 A1    May 25, 2023

(51) Int. Cl.
*H03M 3/04* (2006.01)
*H04L 27/04* (2006.01)
*H03M 3/00* (2006.01)

(52) U.S. Cl.
CPC ............. *H03M 3/042* (2013.01); *H03M 3/00* (2013.01); *H04L 27/04* (2013.01)

(58) Field of Classification Search
CPC .......... H03M 3/042; H03M 3/00; H04L 27/04
See application file for complete search history.

(56) References Cited

U.S. PATENT DOCUMENTS

| | | | | |
|---|---|---|---|---|
| 10,498,572 | B2* | 12/2019 | Fleming | H04L 27/144 |
| 2006/0072753 | A1* | 4/2006 | Nishimura | H04L 9/0891 |
| | | | | 380/262 |
| 2016/0080141 | A1* | 3/2016 | Theiler | H04L 5/1423 |
| | | | | 375/353 |
| 2017/0201402 | A1* | 7/2017 | Taya | H04W 52/52 |

* cited by examiner

*Primary Examiner* — Sung S Ahn

(57) ABSTRACT

Current Wireless transmission volume is such that techniques to compress transmitted data is the object of ongoing technical enhancements. The Invention consists of methods of using rapid changes in signal voltage to convey additional data which may be used for Data Compression, Encryption, and other purposes. They include varying amounts of change referred to as Encode Amplitude (EA) and Baseline Modulation (BM) using a change down to baseline voltage.

11 Claims, 4 Drawing Sheets

- At clock point 2 read voltage valve and compare with maximum
- "Table look up" says 5 segments = 0101

- At clock points read voltage value
- If at or near baseline assign binary 1
- Otherwise binary 0
- Result, outgoing 0101

METHOD OF MODIFYING AN ANALOG WAVE OR DIGITAL PULSE TO CONVEY ADDITIONAL DATA WITH EACH WAVE OR PULSE

FIELD OF INVENTION

The invention relates to analog and digital signal transmission and in particular the use of momentary drops in amplitude at set points to convey additional data. This data may be used for functions such as data compression, signal identification, communication data, encryption, and others.

DESCRIPTION OF RELATED ART

Referenced U.S. Pat. No. 9,614,710 B2 uses methods which modulate the wave form such that simultaneous use of techniques such as QAM and PSK is not feasible. U.S. Ser. No. 10/498,572 B2 uses coded packets which also can allow techniques such as QAM but is not workable when Quantized format is employed. U.S. Ser. No. 10/791,014 B2 uses a modulation technique which would not be viable for Quantized format transmission.

BACKGROUND OF THE INVENTION

A fundamental need in all communication now exists to convey the maximum data during a specific span of time.

In the case of digital transmission, current methods mainly focus on approaches such as using "code words" to represent longer sequences of digital bits or complex interleaving of data segments. Others make use of shifting the analog wave. Others use "lossy" "non-universal" methods. In these data is disposed of and the method is useful for a particular type of data. For example, MPEJ and JPEG relate to images and are based on the tolerance of loss of some resolution.

The use of code words is rather straight forward but limited in the amount of additional data conveyed. For example, when used for data compression ratios are limited to about 2 to 1.

OBJECT OF THE INVENTION

This invention allows significantly more data to be represented in each wave or pulse. A skilled practitioner in the art using two multiples of the Encoded Amplitude Method could increase ratios to 8 to 1.

Of major note is that both the EA and BM techniques are resistant to changes in a waveform, such as attenuation. With EA, the encoded value is determined by the differential between points on the waveform. They will change proportionately as the wave loses some of its amplitude. With Baseline Modulation, attenuation has no impact. Further, "noise" at the ACP can be handled by a noise cancelation approach, detecting the noise voltage, and backing out that amount from the system's ACP voltage.

Of note is that when Quantized Stair Step formatted communication is used the sharp steps generated lead to high frequency resonate emissions. However, it is common practice to employ low pass filters to round off the corners. This may also be used for the Amplitude Drops presented.

The major object of this invention is to transmit a greater amount of data in a manner that is lossless and universal. Another object is that the additional data is versatile and can be used in various ways easily according to the needs of the deployment. Another objective is achieving enhancement with little infrastructure change.

SUMMARY OF THE INVENTION

For the method referred to as Encoded Amplitude (EA), in a single iteration of Encoded Amplitude the transmitting uses deployment defined "clocks" to determine timing for two segments of the waveform, the peak of the wae (Amplitude Maximum) and one point designated for a drop in amplitude (Amplitude Change Point). Digital data is read into the buffer. Based on its value the signal generator's voltage is momentarily dropped, timed by the clock for the ACP.

When the wave is received the data must be derived. This is done by comparing the voltage of the Amplitude Maximum with the voltage at the Amplitude Change Point When the clock period set for the Amplitude Maximum is reached the voltage is read and stored. Likewise, when the Amplitude Change Point is reached the voltage is read. The differential is determined. The differential is used to drive the tsignal generator at the ACP.

In a multiple iteration deployment, more than one Amplitude Change point is imposed on the waveform. The user may use the additional iterations to restate the value. When read, if at least two have the same value this value is used and deemed to be free of signal interference. If used for additional compression, the digital values ae added to obtain the final digital value to be generated. Further, the use of Noise Cancelation may make it unnecessary to use redundancy and enable the additional Amplitude Drops to be used for additional data. Thus, multiple Amplitude Change Points can be designated across the wave or digital pulse. For example, one ACP allows for 16 possible states. This accommodates 4 bits. More ACPs can represent more states and thus more bits This technique has, among several advantages, the ability to be accurate and useful despite effects such as signal attenuation, for the differential will remain the same even as the waveform or pulse undergoes change during transmission to its reception For the BM method, outgoing digital data is represented as an Amplitude Drop down to the wave (or digital pulse) baseline, to represent a binary 1. A binary O results in no change at the ACP. At the receiving end, as the Amplitude Change Points are reached, an Amplitude Drop to near baseline generates a binary 1. If the ACP is nearly unchanged (allowing for impact of noise), a binary O is generated.

Both variants have the attribute of being Universal, Lossless, and Complementary to existing methods such as QAM or PSK. They can be resistant to "noise" and are achieved by software enhancement rather than the expense/time needed for addition of infrastructure components. Further they may be applied to quantized stair step format transmission.

Figure 1:
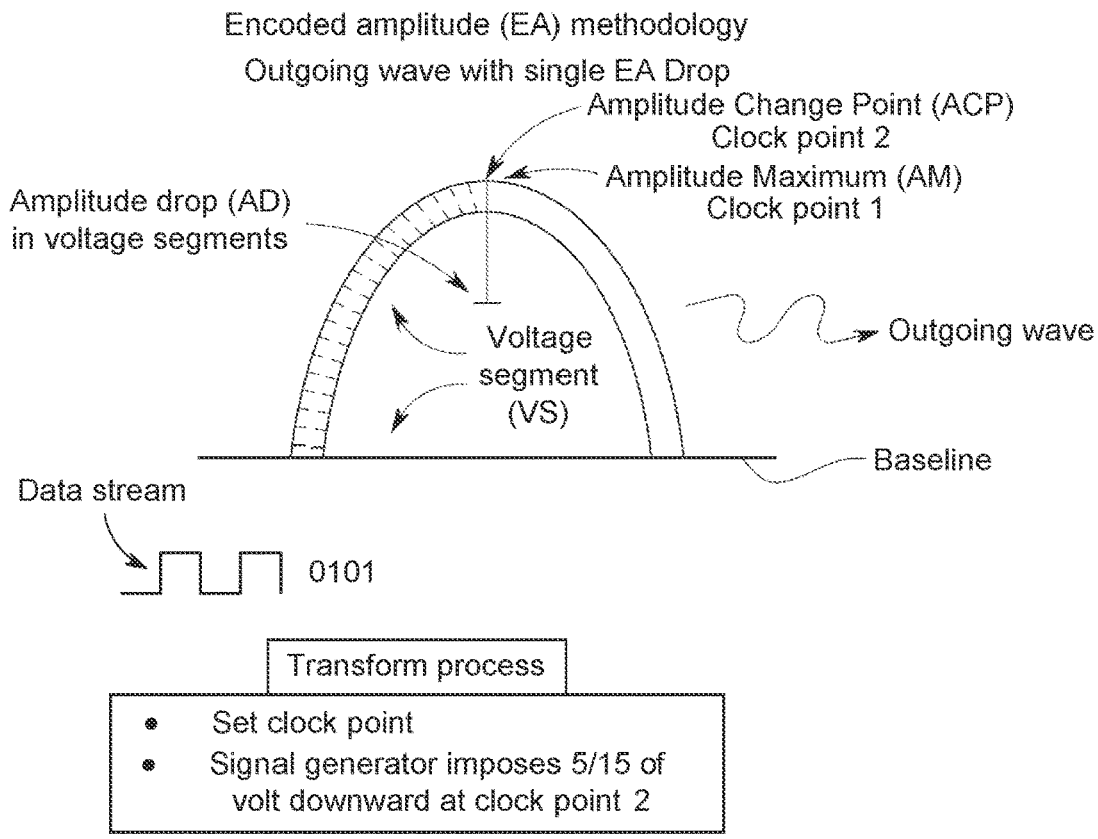
FIG. 1.
Figure 2:
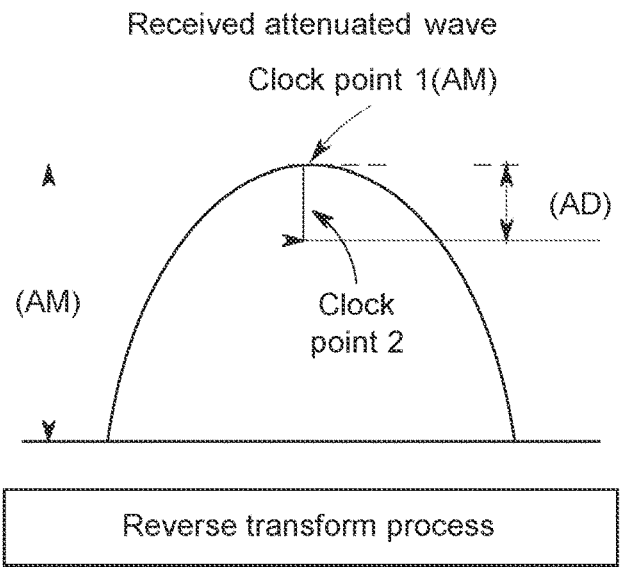
Figure 3:
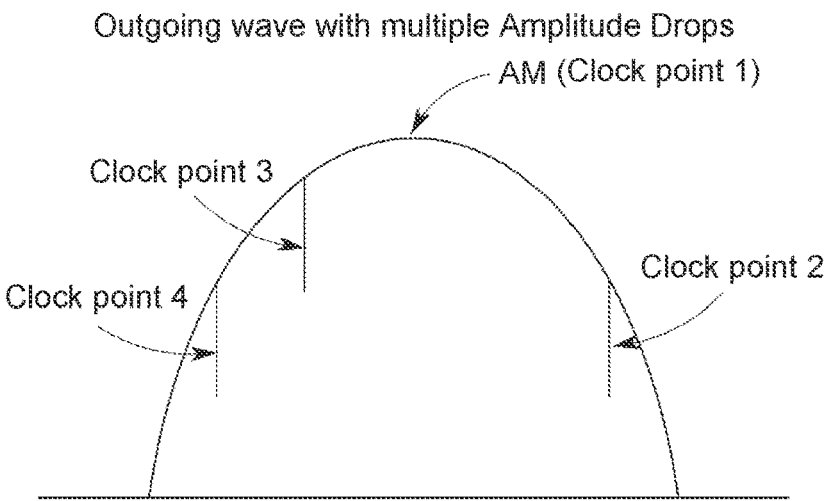
Figure 4:
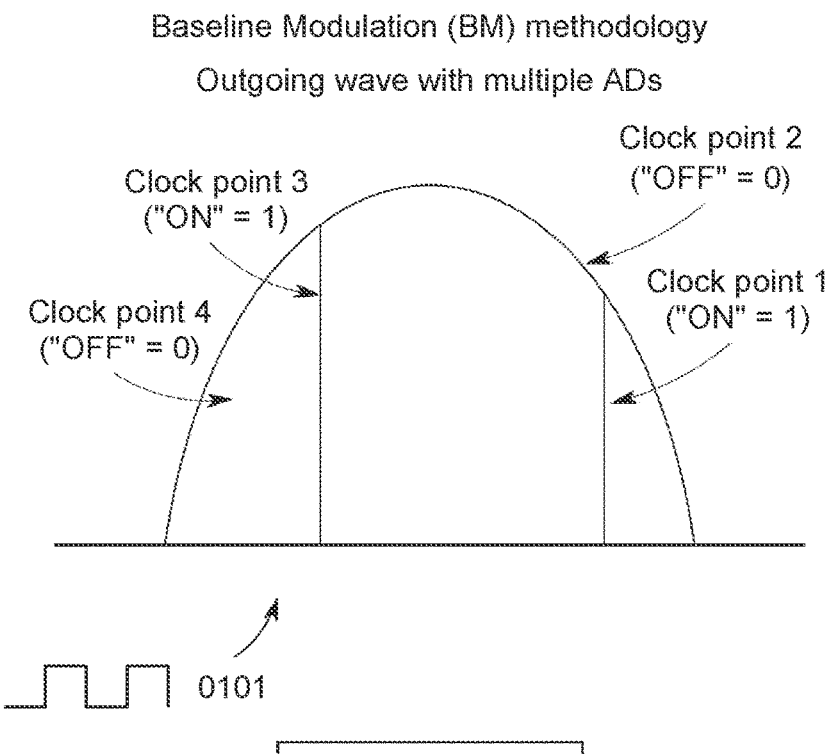
Figure 5:
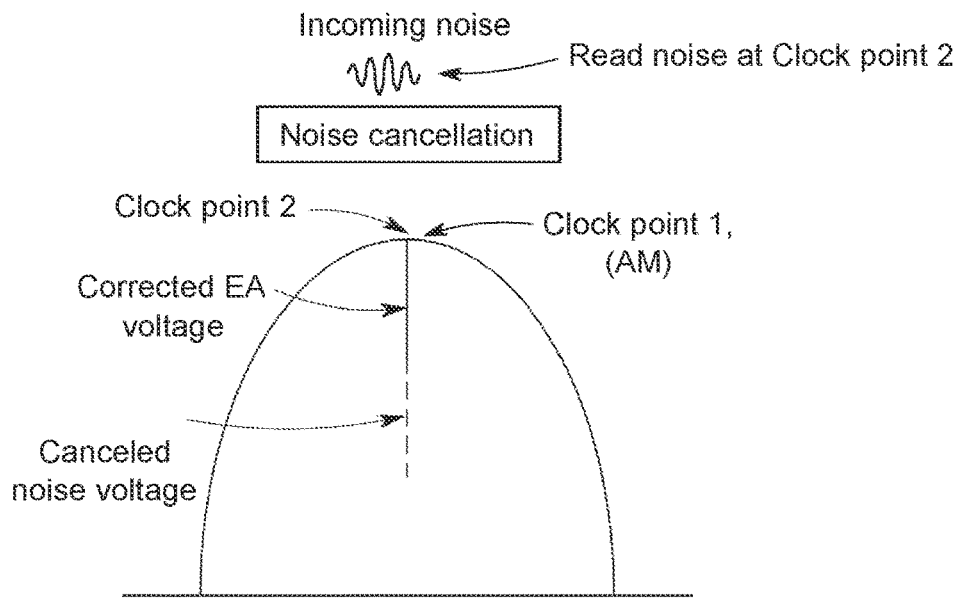
Figure 6:
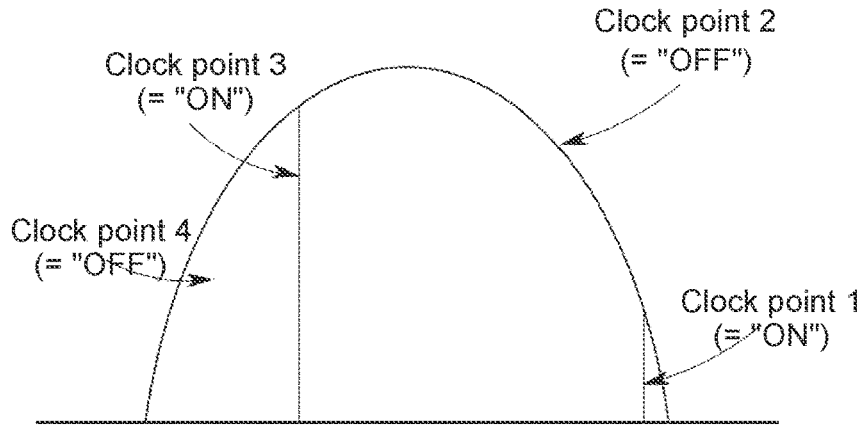
Figure 7:
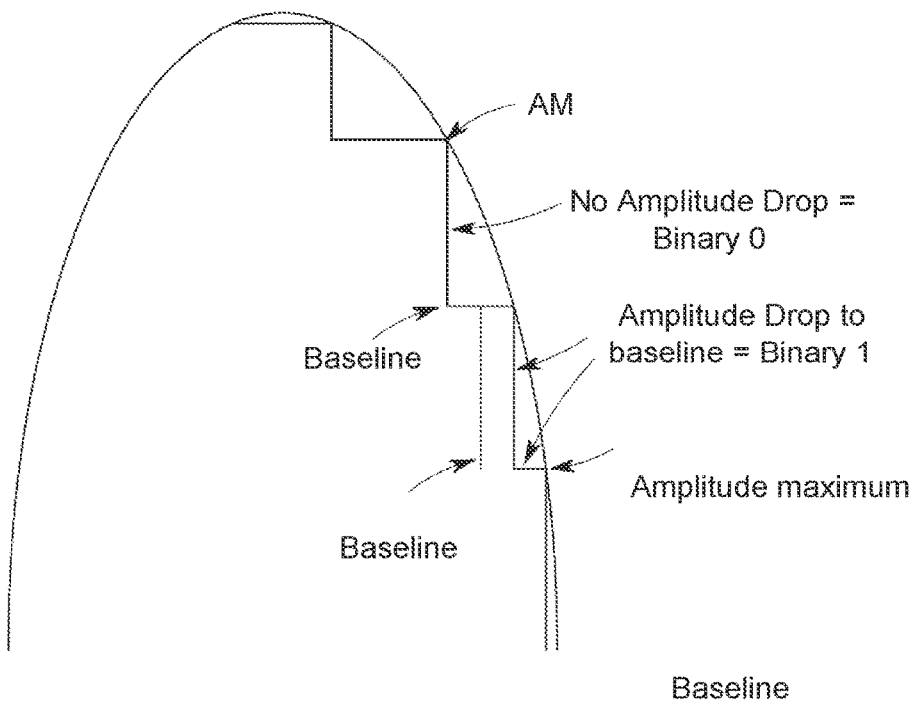
Figure 8:
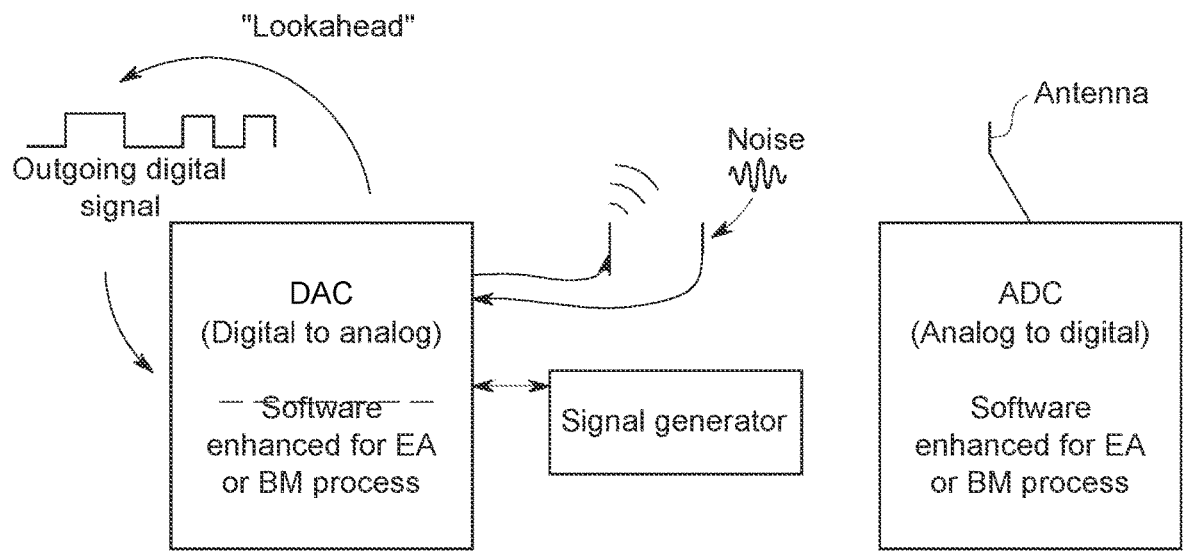

Outgoing digital data (0101, which is decimal 5) is fed into an enhanced signal generator. The wave (W) has been generated by a signal generator. "Clocks" 1 and 2 have been established, 1 for the Amplitude Maximum, 2 for the Amplitude Change Point. Clock 2 determines a time that is slightly offset from the Clock 1 time. SG, the signal generator is momentarily decreased in voltage by the amount determined in the circuit) when Clock 2 occurs and the signal is transmitted.

FIG. 2.

Even though the total amplitude of the wave has diminished (attenuated) the changes are proportional. Using Clocks 1 and 2 in the receiving end, the voltage values are read and compared. The differential AM/AC=5 and thus the digital signal generator emits the bits 01.01(viewed numerically as 5).

FIG. 3.

An enhanced deployment may add additional data using multiple Amplitude Drops. Clock Point 1 is used for the Amplitude Maximum position on the wave. Clock 2 identifies the first Amplitude Change Point (in this case positioned prior to the Amplitude Maximum). Additional Clocks would be designated for the additional ACPs.

FIG. 4.

This figure represents the alternative Baseline Modulation methodology. Clocks are used. With BM, Amplitude Maximum is not of concern and is omitted. However, the Baseline is needed (o volts, if a Return to Zero scheme is used). The outgoing bit stream to be imposed on the wave is put into the Transformation Process and the Amplitude Drops are imposed at the appropriate Clock Points.

In the figure, there are Amplitude Drops imposed at clock point 1 and 3. They are absent at clock points 2 and 4. The outgoing wave represents, therefore binary 0101.

FIG. 5.

Noise cancelation is presented. (The method being used is EA but applies to BM as well). The "Noise" voltage value is sensed and is added or subtracted to eliminate it's impact on the Amplitude Drop.

FIG. 6.

Baseline Modulation is received. The Reverse Transform process is listed. ADs are detected at the Baseline at Clock Point 1 and clock point 3 and are considered as "On" or binary 1s. Clock Point 2 and 4 have no Baseline Modulation and are, therefor considered binary O's. The binary output to the receiving system is, therefore, 0101.

FIG. 7.

Baseline Modulation is employed in a wave form which carries Quantized formatted data. At each "Stair Step" the top of the step is that step's AM and it's starting value is Baseline and detected for an AD.

FIG. 8.

The key technical components are shown performing their function in the EA or BM techniques. The DAC has been software enhanced to perform either of the two methods chosen. The Signal Generator is shown as it will be used to make the signal changes required. The Antenna system performs both the transmission (and receipt) of the modified signal as well as being used to detect "Noise" at the AD points.

In the receiving end a Analog to Digital Converter (ADC) performs the reverse transform processes.

DETAILED DESCRIPTION OF THE INVENTION

For the method referred to as (Encoded Amplitude [EA], in a single iteration of Encoded Amplitude the transmitting process uses the "Clocks" to time the reading of amplitude values for two points on the waveform, the peak of the wave (Amplitude Maximum) and one point designated for a drop in amplitude (Amplitude Change Point). Digital data is read into the buffer. Based on its value the signal generator's voltage is momentarily dropped, timed by the clock for the ACP.

Thus, if a wave has an Amplitude Maximum of 1 volt, this total voltage is segmented, say into 15 values. The first brackets 1 volt. The second brackets $14/15^{th}$ of a volt. The third brackets $13/15_{th}$ of a volt. This continues down to $1/15^{th}$ volt.

To represent 4 binary bits, there are 15 possible states, starting with 0000 (as the low value, numeric 0) and ending with binary 1111 (the high value, numeric 15). If 4 bits are read into the buffer at a time, the circuitry determines which state is needed to represent it. One might think of a "Table Lookup" in software code as being analogous to this conversion process.

When the wave is received the data must be derived. This is done by comparing the voltage of the Amplitude Maximum with the voltage at the Amplitude Change Point. When the clock period set for the Amplitude Maximum is reached the voltage is read and stored. Likewise, when the Amplitude Change Point is reached the voltage is read. The differential is determined.

In a multiple iteration deployment, more than one Amplitude Change point is imposed on the waveform. The user may use the additional iterations to restate the value. When read, if at least two have the same value this value is used and deemed to be free of signal interference. If used for additional compression, the digital values are added to obtain the final digital value to be generated.

Deployments may make use of multiple Amplitude Change Points in varying ways. For example, for data compression, the data in one may be used with the others to increase the compression ratio. If two are used as described above, the ration now becomes 8 to 1. Other uses include, restating the same Amplitude Drop value to overcome signal interference, to identify a request for a communication session, encryption, and others.

In a single EA Amplitude Drop, if the Amplitude Maximum is divided into 15 voltage segments and the digital input is read in 4 bit segments a data compression of 4 to 1 is achieved when compared with basic analog transmission including transmission with P5K and the like employed, There are two fundamental obstacles to be overcome. One is loss of signal strength or "attenuation". This is easily overcome by the fact that the receiving conversion process is only looking for the differential between the Amplitude Maximum and the Amplitude Drop. If the wave is now 2 volt, each of the 15 segments (in the 4 bit usage example) will be reduced to 34 of their original value range or bracket. But the analysis/conversion remains the same.

A more difficult obstacle is noise interference. The user of the EA method may choose to include a number of noise correction processes to overcome erroneous changes to the Amplitude Drop. A predictive method will evaluate the noise wave just before the Amplitude Change Point. Since it is most often in a sine wave form, at the ACP its inverse value will be distorting the Amplitude Drop. So, that amount (upward or downward) is "backed out" of the Amplitude Drop before conversion. In most cases it will be correct, no retransmission will be necessary.

When multiple EA points are used, they can be used to increase the additional data conveyed on the wave or pulse. Alternatively, if a noisy environment is sensed, they may be used to "restate" the value being sent. Logically, if three are used and two out of three have the same value, that value can be used as the intended one. Not often will noise interfere with all three in such a way that the noise cannot be corrected. A preferred embodiment uses multiple EA points together with noise cancellation.

For the BM method, outgoing digital data is represented as an Amplitude Drop down to the wave(or digital pulse) baseline, to represent a binary 1. A binary O results in no change at the ACP. At the receiving end, as the Amplitude Change Points are reached, an Amplitude Drop to near baseline generates a binary 1. If the ACP is nearly unchanged (allowing for impact of noise), a binary O is generated.

The invention claimed is:

1. A method of conveying data on a wave or pulse, the method comprising:
   timed changes in amplitude wherein the changes when evaluated supply additional data which achieves data compression, encryption, and ether enhanced data communication;
   receiving an outgoing digital data and processing it via device specific Digital To Analog Converter (DAC) to generate voltage values;
   sending said voltage values to a DAC buffer;
   receiving additional outgoing digital data via lookahead;
   establishing an Amplitude Maximum (AM) based on said voltage values in said buffer;
   establishing an Amplitude Change Point (ACP), which is slightly offset from the AM;
   setting voltage segments in one deployment using the binary value of the said additional outgoing data;
   wherein the voltage segment constitutes an Amplitude Drop (AD) creating an Encoded Amplitude (EA);
   sending said voltage values and voltage segments to a signal generator;
   imposing said voltage values and voltage segments on said wave or pulse;
   transmitting said wave or pulse to a receiving device;
   receiving said wave or pulse at a receiving device;
   at a receiving device extracting said voltage values and voltage segments from received said wave or pulse;
   at the Amplitude Maximum and Amplitude Change Point analyzing the voltage values and voltage segments, using a software enhanced Analog to Digital Converter (ADC);
   comparing the analyzed voltage values and voltage segments to establish their differential Amplitude Drop (AD);
   generating digital bits using said differential Amplitude Drop (AD).

2. The method of claim 1, wherein conveying data on a wave or pulse further comprising:
   creating multiple occurrences of the Encoded Amplitude (EA) on said wave or pulse wherein said multiple occurrences of EA convey additional data.

3. The method of claim 1, wherein receiving and processing the outgoing digital data through the Digital to Analog Converter (DAC) further comprising:
   using an additional synchronized channel.

4. The method of claim 1, wherein creating the Encoded Amplitude (EA) further comprising:
   creating the multiple quantized steps wherein the quantized step is used as the Amplitude Maximum (AM) and the starting point of the step is used as the Baseline.

5. The method of claim 1, wherein creating the Encoded Amplitude (EA) further comprising:
   using the voltage segments as increases in voltage rather than decreases.

6. The method of claim 1, wherein conveying data on a wave or pulse further comprising:
   detecting the noise voltage at the amplitude change point;
   applying the noise cancellation at the amplitude change point.

7. A method of conveying additional data on the wave or pulse comprising:
   receiving an outgoing digital data and processing it via device specific Digital To Analog Converter (DAC) to generate voltage values;
   sending said voltage values to a DAC buffer;
   receiving additional outgoing digital data via lookahead;
   determining Amplitude Maximum (AM) of said voltage values in the buffer;
   establishing multiple Amplitude Change Points (ACP) along the wave or pulse;
   using each digital bit of the additional outgoing digital data to determine whether each Amplitude Change Point has an Amplitude Drop (AD) imposed, wherein;
   a baseline is zero volts;
   creating a Baseline Modulation wherein Amplitude Drops (ADs) to baseline at the Amplitude Change Points (ACP) occur when a binary 1 in the additional outgoing digital data is processed and no Amplitude Drops (ADs) to the baseline at the ACP occurs when a binary 0 in the additional outgoing digital data is processed;
   sending said voltage values and Amplitude Drops of Baseline Modulation to a Signal Generator;
   imposing said voltage values and Amplitude Drops on wave or pulse;
   transmitting wave or pulse with Amplitude Drops and voltage values to a receiving device;
   receiving said wave or pulse with Amplitude Drops and voltage values at the receiving device;
   at the receiving device, extracting said voltage values and Amplitude Drops from received wave or pulse;
   at the Amplitude Maximum and Amplitude Change Points, analyzing the voltage values and Amplitude Drops using a software enhanced Analog to Digital Converter (ADC), wherein;
   a binary 1 is generated when each Amplitude Drop is read and found to near to the base line, and;
   a binary 0 is generated when each Amplitude Drop is read and found to be near to an unchanged state.

8. The method of claim 7, wherein receiving and processing the outgoing digital data through the Digital to Analog Converter (DAC) further comprising:
   using an additional synchronized channel.

9. The method of claim 7, wherein creating the Baseline Modulation (BM) further comprising:
   creating the multiple quantized steps wherein the quantized step is used as the Amplitude Maximum (AM) and the starting point of the step is used as the Baseline.

10. The method of claim 7, wherein creating a Baseline Modulation further comprising:
    using the Amplitude Drops as increases in voltage rather than decreases in voltage.

11. The method of claim 7, wherein conveying additional data on the wave or pulse further comprising:
    detecting the noise voltage at the amplitude change point;
    applying the noise cancellation the amplitude change point.

* * * * *